United States Patent
Sugimoto et al.

(10) Patent No.: US 10,121,503 B2
(45) Date of Patent: Nov. 6, 2018

(54) SUSPENSION BOARD WITH CIRCUIT HAVING THINNED INSULATING SECOND PORTION OVERLAPPING SECOND TERMINAL

(71) Applicant: NITTO DENKO CORPORATION, Osaka (JP)

(72) Inventors: Yuu Sugimoto, Osaka (JP); Hiroyuki Tanabe, Osaka (JP)

(73) Assignee: NITTO DENKO CORPORATION, Osaka (JP)

(*) Notice: Subject to any disclaimer, the term of this patent is extended or adjusted under 35 U.S.C. 154(b) by 0 days.

(21) Appl. No.: 15/689,695

(22) Filed: Aug. 29, 2017

(65) Prior Publication Data
US 2018/0075871 A1 Mar. 15, 2018

(30) Foreign Application Priority Data
Sep. 15, 2016 (JP) .................. 2016-180815

(51) Int. Cl.
| | |
|---|---|
| G11B 5/48 | (2006.01) |
| H05K 1/05 | (2006.01) |
| H05K 3/00 | (2006.01) |
| H05K 3/06 | (2006.01) |
| H05K 3/40 | (2006.01) |
| H05K 1/11 | (2006.01) |
| H05K 1/18 | (2006.01) |
| G11B 5/00 | (2006.01) |
| G11B 5/31 | (2006.01) |
| H05K 3/34 | (2006.01) |

(52) U.S. Cl.
CPC .......... *G11B 5/4853* (2013.01); *H05K 1/119* (2013.01); *H05K 1/184* (2013.01); *H05K 3/0023* (2013.01); *H05K 3/0041* (2013.01); *H05K 3/06* (2013.01); *H05K 3/4015* (2013.01); *G11B 5/3163* (2013.01); *G11B 2005/0021* (2013.01); *H05K 1/056* (2013.01); *H05K 3/3405* (2013.01); *H05K 2201/09063* (2013.01); *H05K 2201/09154* (2013.01); *H05K 2201/09827* (2013.01); *H05K 2201/10106* (2013.01)

(58) Field of Classification Search
None
See application file for complete search history.

(56) References Cited

U.S. PATENT DOCUMENTS

2013/0215726 A1 8/2013 Fujimura et al.

FOREIGN PATENT DOCUMENTS

JP 2013-200934 A 10/2013

*Primary Examiner* — Craig A. Renner
(74) *Attorney, Agent, or Firm* — Edwards Neils LLC; Jean C. Edwards, Esq.

(57) ABSTRACT

A suspension board with circuit having an opening with an electronic element inserted therein includes an insulating layer disposed at the edge of the opening, a first terminal disposed at one surface of the insulating layer and connected to a magnetic head, and a second terminal disposed at the other surface thereof and connected to the electronic element. The insulating layer includes a first portion in which the first terminal is disposed and a second portion that extends from the first portion toward the opening and is overlapped with a slider. The second portion is thinner than the first portion and is overlapped with the second terminal. The slider has a first surface facing the second portion. The first surface is disposed between the first terminal and the second terminal.

5 Claims, 10 Drawing Sheets

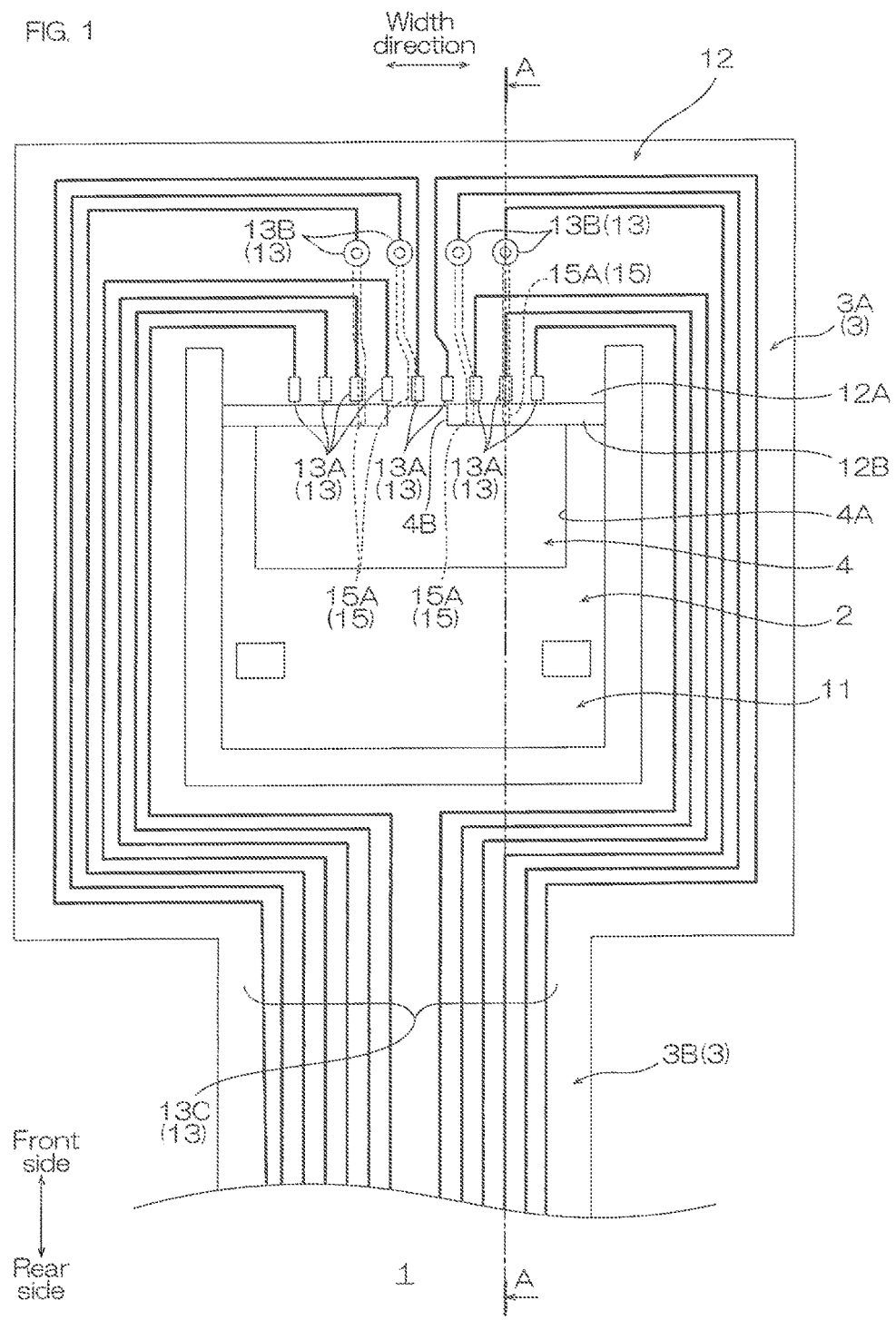

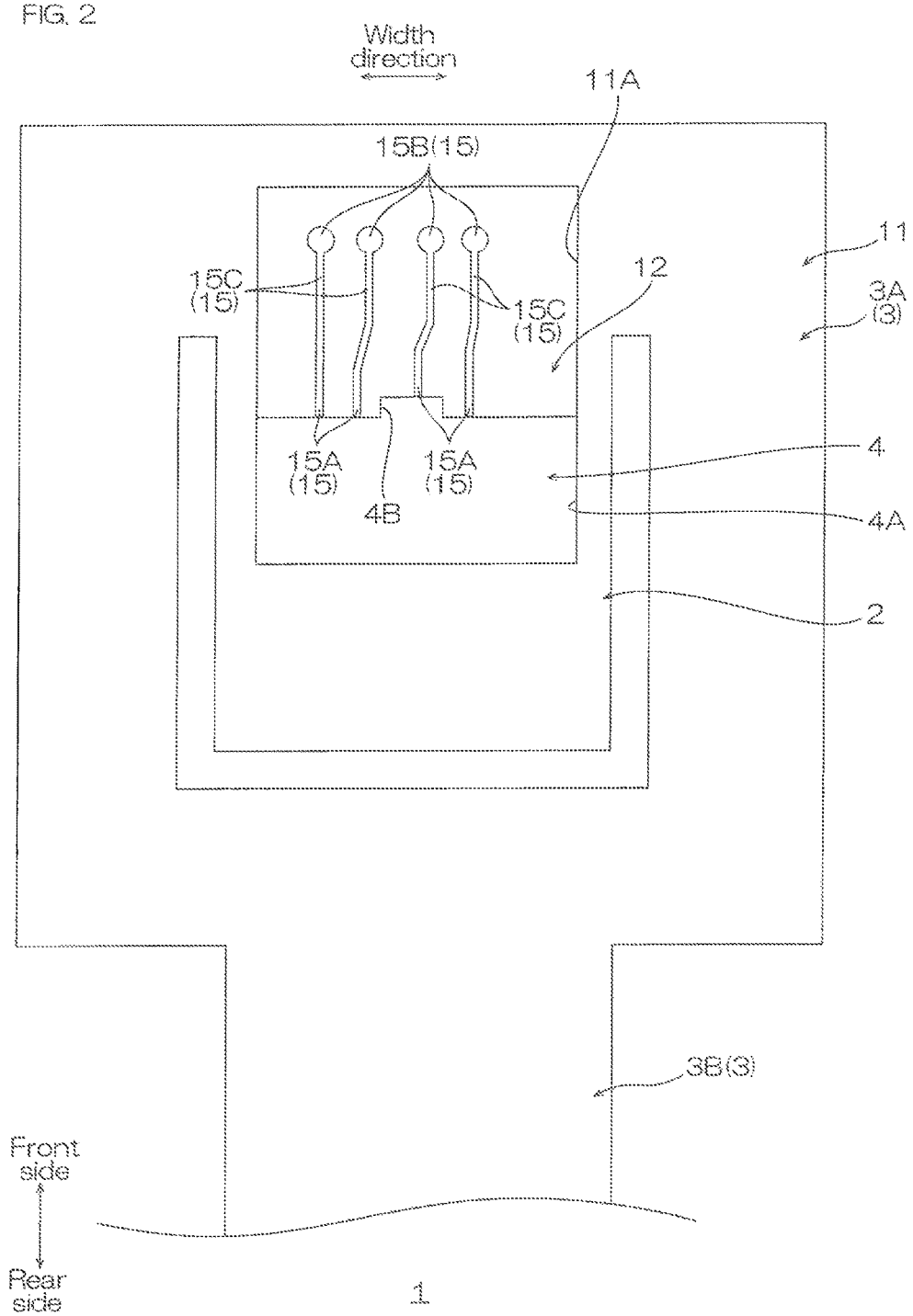

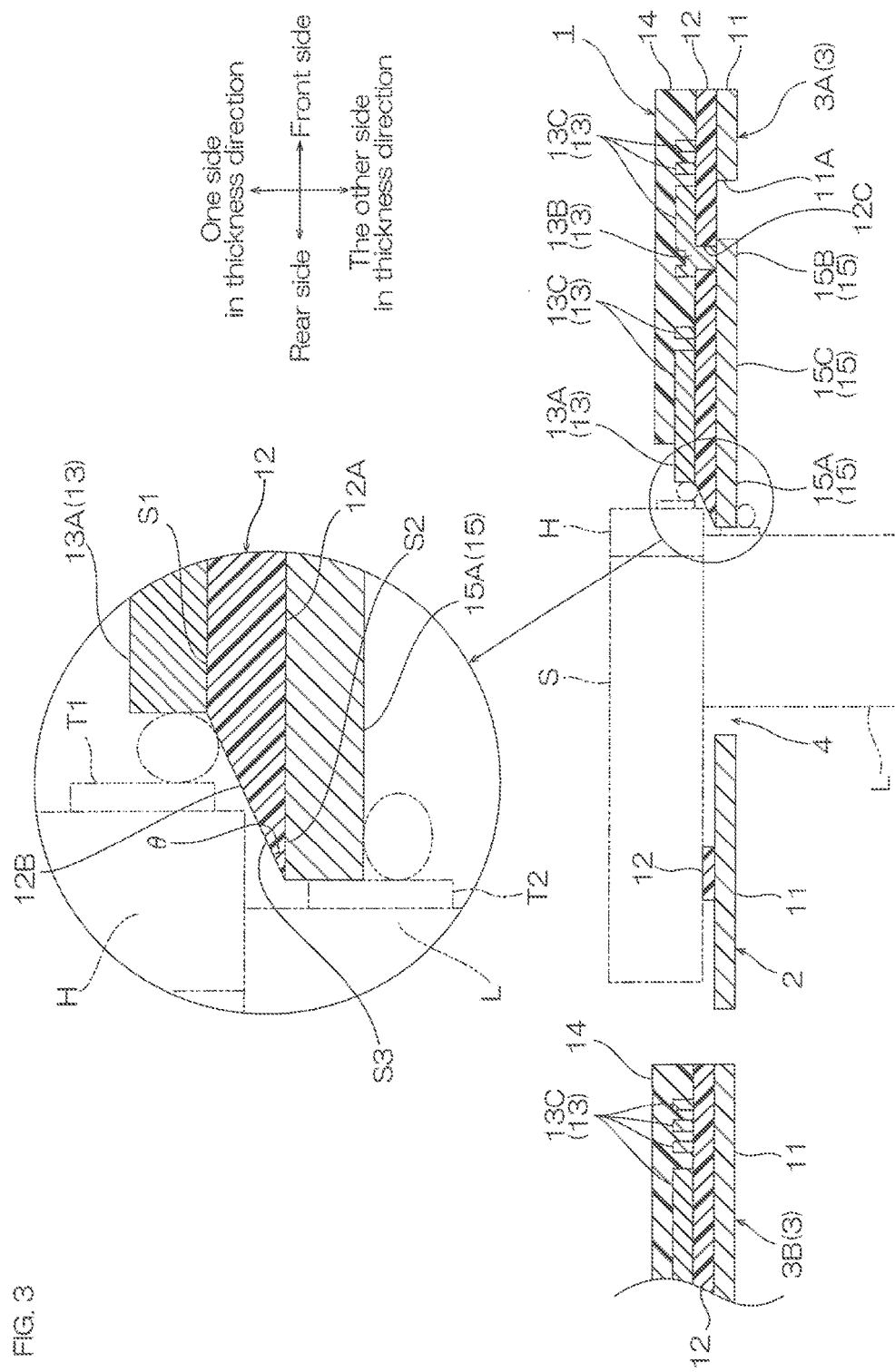

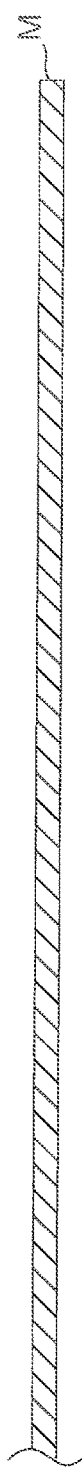
FIG. 4A
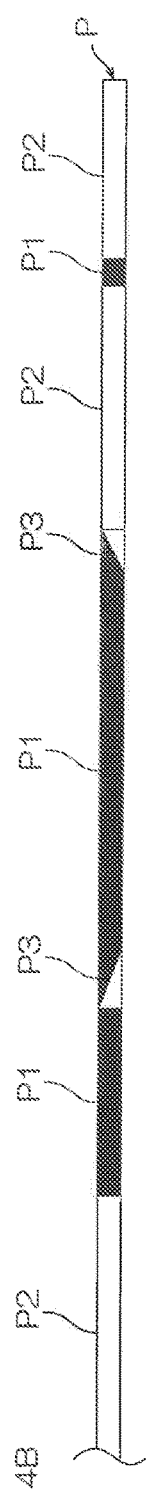
FIG. 4B
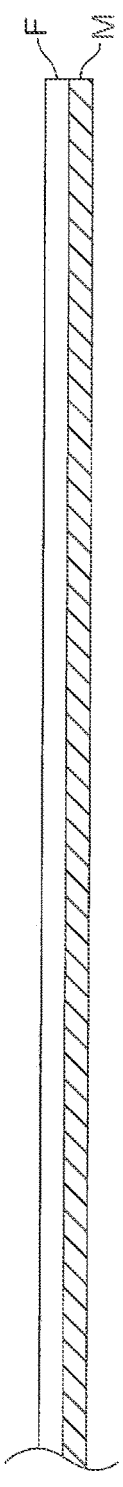
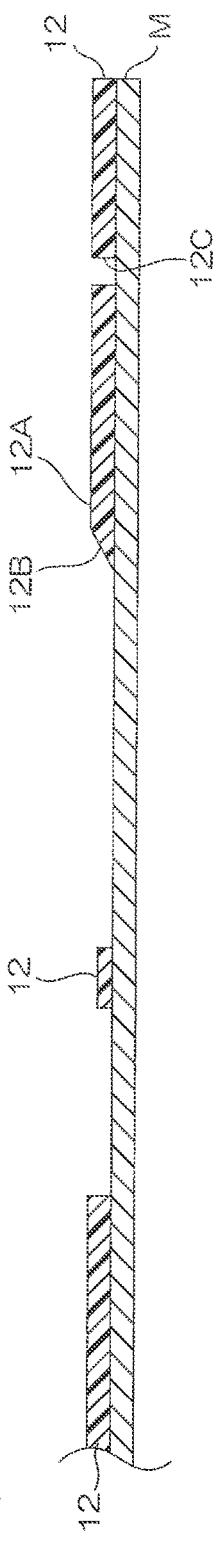
FIG. 4C

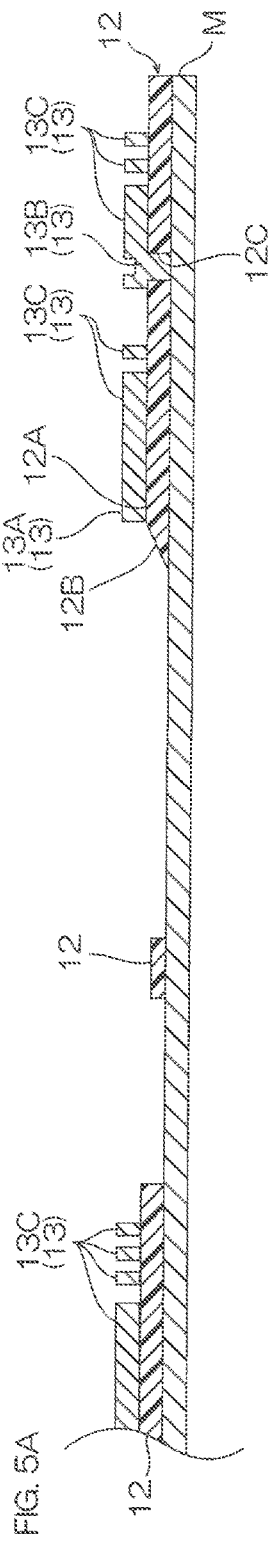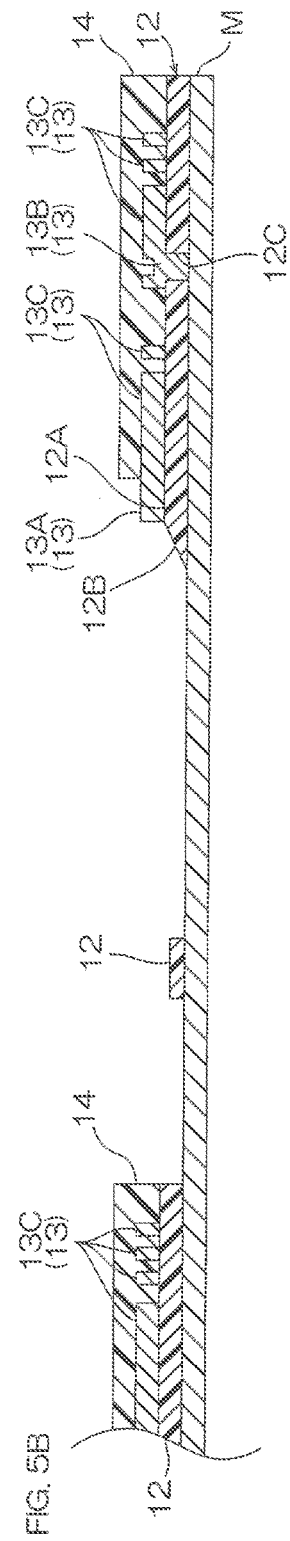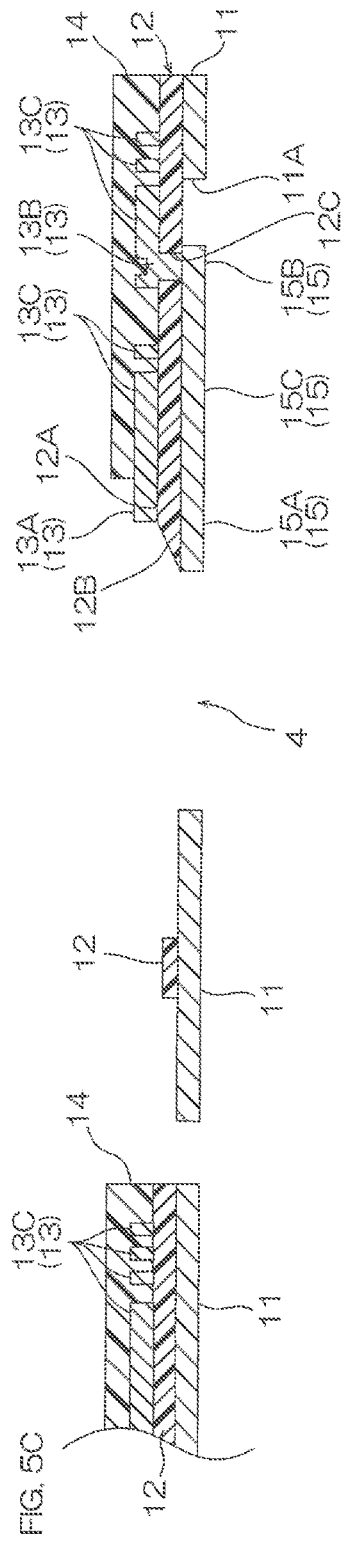

SUSPENSION BOARD WITH CIRCUIT HAVING THINNED INSULATING SECOND PORTION OVERLAPPING SECOND TERMINAL

CROSS-REFERENCE TO RELATED APPLICATION

The present application claims priority from Japanese Patent Application No. 2016-180815 filed on Sep. 15, 2016, the contents of which are hereby incorporated by reference into this application.

BACKGROUND OF THE INVENTION

Field of the Invention

The present invention relates to a suspension board with circuit, and a producing method thereof.

Description of Related Art

As a suspension board with circuit to be mounted on a hard disk drive, a suspension board with circuit on which a slider having a magnetic head is capable of being mounted has been conventionally known.

In such a suspension board with circuit, in order to adopt a thermally assisted magnetic recording method, mounting of a slider unit that includes a slider having a magnetic head, and a light emitting element to be mounted on the slider has been proposed (ref: for example, Japanese Unexamined Patent Publication No. 2013-200934).

In the suspension board with circuit, an opening portion into which the light emitting element is inserted is provided. In the suspension board with circuit, a head-side terminal provided on the upper surface thereof is electrically connected to the magnetic head, and an element-side terminal provided on the lower surface thereof is electrically connected to an optical element.

SUMMARY OF THE INVENTION

In the suspension board with circuit described in Japanese Unexamined Patent Publication No. 2013-200934, there is a demand that the slider and the light emitting element are further smoothly mounted thereon.

An object of the present invention is to provide a suspension board with circuit that is capable of being smoothly mounted with a slider and an electronic element, and a producing method thereof.

The present invention [1] includes a suspension board with circuit capable of being mounted with a slider including a magnetic head and an electronic element for assisting the magnetic head, and having an opening with the electronic element inserted therein at the time of mounting of the slider, the suspension board with circuit including an insulating layer disposed at the edge of the opening, a first terminal disposed at one surface of the insulating layer in a thickness direction of the insulating layer and electrically connected to the magnetic head at the time of mounting of the slider, and a second terminal disposed at the other surface of the insulating layer in the thickness direction and electrically connected to the electronic element at the time of mounting of the slider, wherein the insulating layer includes a first portion in which the first terminal is disposed and a second portion that extends from the first portion toward the opening in a plane direction perpendicular to the thickness direction and is overlapped with the slider in the thickness direction at the time of mounting of the slider; the second portion is thinner than the first portion so that one surface gets closer to the other surface and is overlapped with the second terminal in the thickness direction; the slider has a first surface facing the second portion and a second surface disposed at the opposite side to the second portion with respect to the first surface in the thickness direction; and the first surface is disposed between the first terminal and the second terminal at the time of mounting of the slider.

According to the structure, the second portion is formed thinner than the first portion so that one surface of the insulating layer gets closer to the other surface thereof.

Thus, by using a space at one side in the thickness direction of the second portion, the slider can be disposed at one side in the thickness direction of the second portion. In this manner, by using the space at one side in the thickness direction of the second portion, the slider can get closer to the first terminal, and the optical element can get closer to the second terminal, while the slider avoids being brought into contact with the insulating layer.

Then, the first terminal can be connected to the slider, and the second terminal can be connected to the optical element in a state where the slider is close to the first terminal, and the optical element is close to the second terminal.

As a result, the suspension board with circuit can be smoothly mounted with the slider and the electronic element.

The present invention [2] includes the suspension board with circuit described in the above-described [1], wherein the second portion includes an inclined surface that gradually inclines from one surface toward the other surface as it goes from the first portion toward the opening.

According to the structure, the space can be formed at one side in the thickness direction of the second portion with an easy structure.

The present invention [3] includes the suspension board with circuit described in the above-described [1] or [2], wherein a portion of the second terminal is overlapped with a portion of the first terminal in the thickness direction.

According to the structure, compared to a case where any one of the first terminal and the second terminal is entirely overlapped with any other one of the first terminal and the second terminal, a connecting portion of the first terminal to the slider can be displaced from a connecting portion of the second terminal to the optical element.

As a result, a short circuit between the connecting portion of the first terminal to the slider and the connecting portion of the second terminal to the optical element can be more surely prevented.

When the first terminal and the second terminal are largely displaced so as not to be overlapped with each other, the suspension board with circuit may increase in size.

However, according to the above-described structure, a portion of the second terminal is overlapped with a portion of the first terminal, so that an increase in size of the suspension board with circuit can be suppressed, while the short circuit between the connecting portion of the first terminal to the slider and the connecting portion of the second terminal to the optical element can be more surely prevented.

The present invention [4] includes the suspension board with circuit described in any one of the above-described [1] to [3], wherein the electronic element includes a main body portion supported by the slider and an emitting portion protruding from the main body portion for emitting light; the plurality of second terminals are provided; and at least one of the plurality of second terminals is electrically connected to the main body portion and is overlapped with the second portion in the thickness direction at the time of mounting of the slider.

According to the structure, the second terminal to be connected to the main body portion of the optical element can be disposed close to the main body portion of the optical element.

As a result, the optical element and the second terminal can be more smoothly connected to each other.

The present invention [5] includes a suspension board with circuit capable of being mounted with a slider including a magnetic head and an electronic element for assisting the magnetic head, and having an opening with the electronic element inserted therein at the time of mounting of the slider, the suspension board with circuit including an insulating layer disposed at the edge of the opening, a first terminal disposed at one surface of the insulating layer in a thickness direction of the insulating layer and electrically connected to the magnetic head at the time of mounting of the slider, and a second terminal disposed at the other surface of the insulating layer in the thickness direction and electrically connected to the electronic element at the time of mounting of the slider, wherein the insulating layer includes a first portion in which the first terminal is disposed and a second portion that extends from the first portion toward the opening in a plane direction perpendicular to the thickness direction and is overlapped with the slider in the thickness direction at the time of mounting of the slider the second portion includes an inclined surface that gradually inclines from one surface toward the other surface as it goes from the first portion toward the opening; the slider has a first surface facing the second portion and a second surface disposed at the opposite side to the second portion with respect to the first surface in the thickness direction; and the first surface is disposed between the first terminal and the second terminal at the time of mounting of the slider.

According to the structure, the second portion includes the inclined surface that gradually inclines from one surface toward the other surface as it goes from the first portion toward the opening.

Thus, by using a space at one side in the thickness direction of the second portion, the slider can be disposed at one side in the thickness direction of the second portion. In this manner, by using the space at one side in the thickness direction of the second portion, the slider can get closer to the first terminal, and the optical element can get closer to the second terminal, while the slider avoids being brought into contact with the insulating layer.

Then, the first terminal can be connected to the slider, and the second terminal can be connected to the optical element in a state where the slider is close to the first terminal, and the optical element is close to the second terminal.

As a result, the suspension board with circuit can be smoothly mounted with the slider and the electronic element.

The present invention [6] includes a method for producing a suspension board with circuit having an opening with an electronic element inserted therein at the time of mounting of a slider including a magnetic head and the electronic element for assisting the magnetic head, and including an insulating layer disposed at the edge of the opening, a first terminal disposed at one surface of the insulating layer in a thickness direction of the insulating layer, and a second terminal disposed at the other surface of the insulating layer in the thickness direction, the method including the steps of forming a photosensitive resin layer on a metal board; forming the insulating layer including a first portion and a second portion extending from the first portion toward the opening in a plane direction perpendicular to the thickness direction and thinner than the first portion by subjecting the photosensitive resin layer to a gradation exposure to light; forming the first terminal on the first portion; and forming the opening and the second terminal including a portion formed from the metal board so as to be overlapped with the second portion in the thickness direction by subjecting the metal board to etching.

According to the method, the insulating layer including the first portion and the second portion can be easily formed by the gradation exposure to light.

As a result, the suspension board with circuit capable of being smoothly mounted with the slider and the electronic element can be easily produced.

BRIEF DESCRIPTION OF THE DRAWINGS

FIG. 1 shows a plan view of one embodiment of a suspension board with circuit of the present invention, and shows a front end portion of the suspension board with circuit.

FIG. 2 shows a plan view of the suspension board with circuit shown in FIG. 1 when viewed from the other side in a thickness direction.

FIG. 3 shows an A-A sectional view of the suspension board with circuit shown in FIG. 1.

FIGS. 4A to 4C show explanatory views for illustrating a method for producing the suspension board with circuit shown in FIG. 1:

FIG. 4A showing a step of preparing a metal board,

FIG. 4B, subsequent to FIG. 4A, showing a step of forming a photosensitive resin layer on the metal board and subjecting the photosensitive resin layer to a gradation exposure to light, and FIG. 4C, subsequent to FIG. 4B, showing a step of developing the photosensitive resin layer that is subjected to the gradation exposure to light and forming a base insulating layer on the metal board.

FIGS. 5A to 5C, along with FIGS. 4A to 4C, show explanatory views for illustrating a method for producing the suspension board with circuit shown in FIG. 1:

FIG. 5A, subsequent to FIG. 4C, showing a step of forming a first conductive pattern on the base insulating layer, FIG. 5B, subsequent to FIG. 5A, showing a step of forming a cover insulating layer on the base insulating layer and the first conductive pattern, and FIG. 5C, subsequent to FIG. 5B, showing a step of forming a metal supporting board and a second conductive pattern by subjecting the metal board to etching.

FIG. 7A showing a state in which the optical element is inserted into an opening of the suspension board with circuit, and the slider is disposed in a slider mounting portion of the suspension board with circuit and FIG. 7B, subsequent to FIG. 7A, showing a state in which the slider and the optical element are moved to the front side.

DETAILED DESCRIPTION OF THE INVENTION

Figure 6:
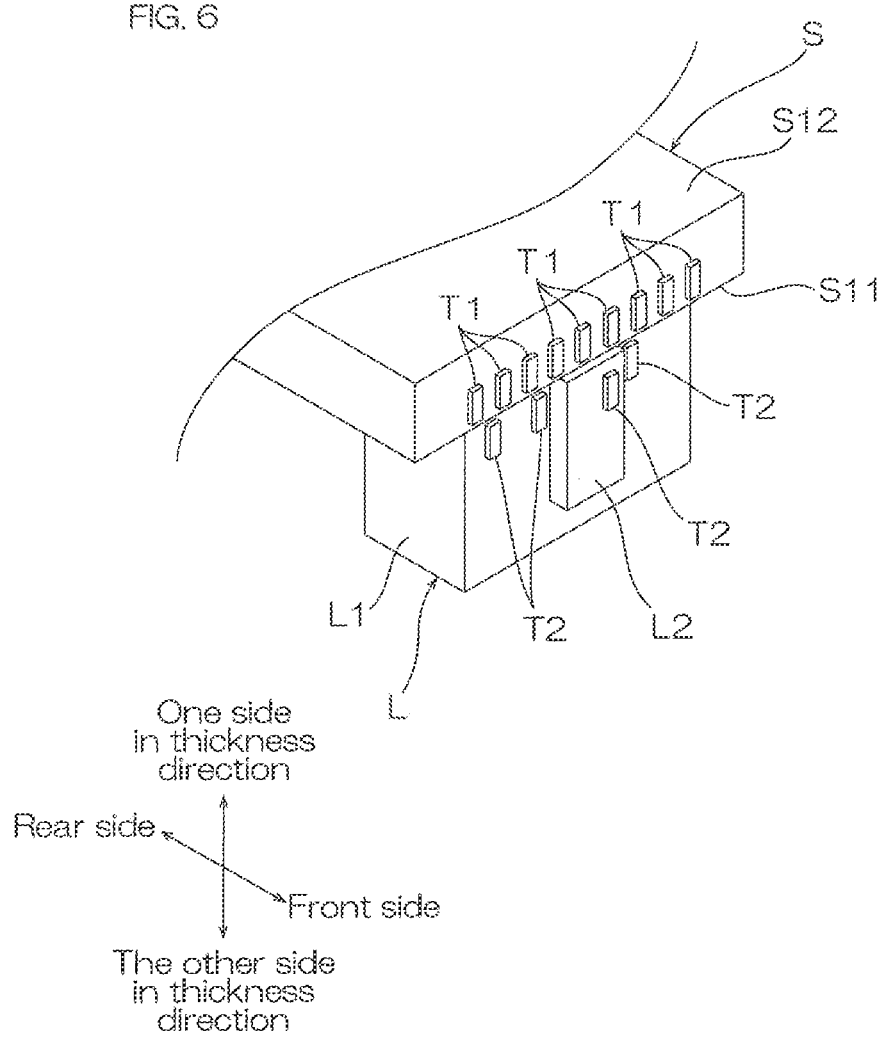
FIG. 6 shows a perspective view of a slider and an optical element mounted on the suspension board with circuit shown in FIG. 1.
Figure 7:
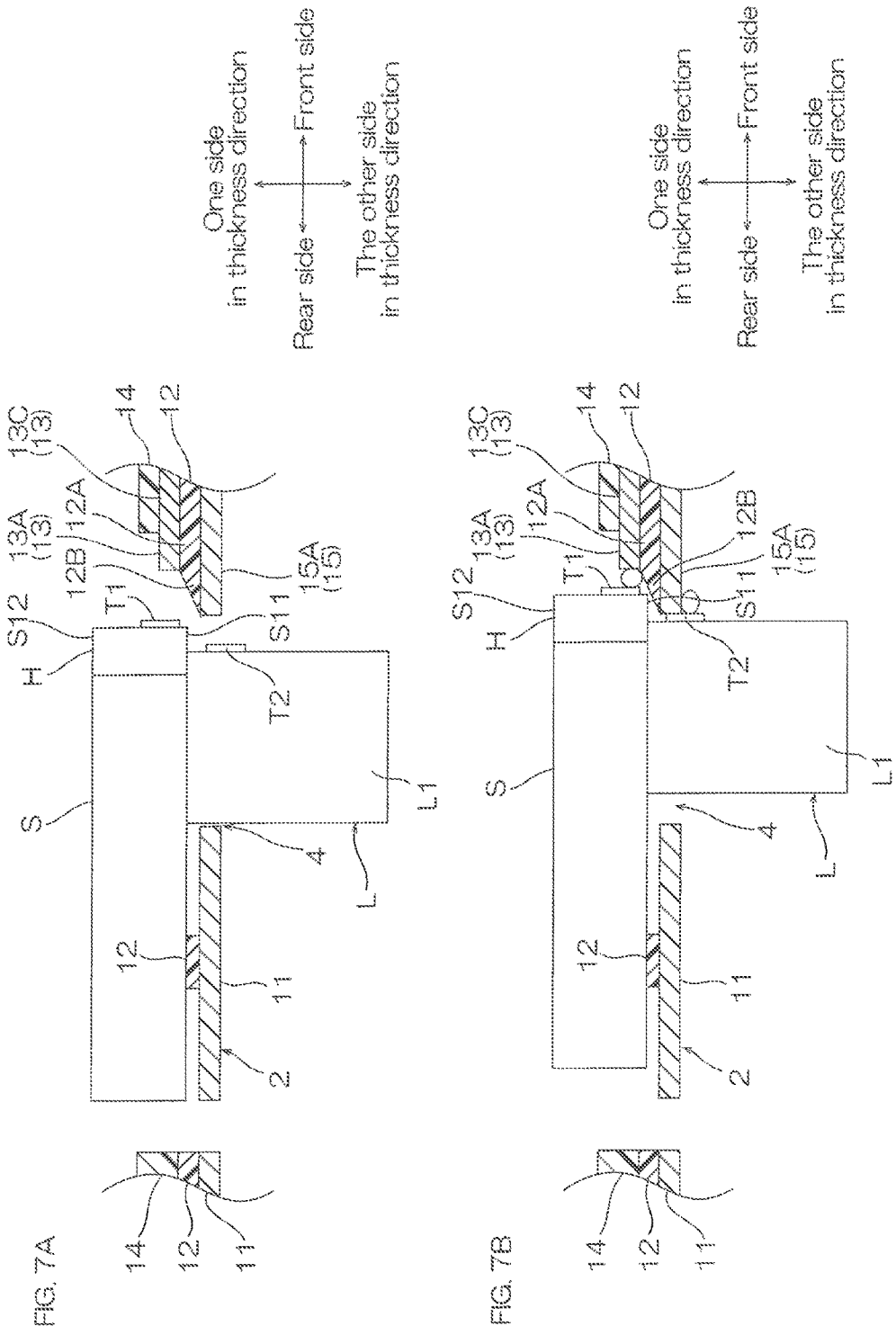
FIGS. 7A and 7B show explanatory views for illustrating the mounting of the slider and the optical element on the suspension board with circuit.

The structure of a suspension board with circuit 1 is described with reference to FIGS. 1 to 3.

The suspension board with circuit 1 is a component that constitutes a head gimbal assembly of a hard disk drive (to be more specific, hard disk drive adopting a thermally assisted magnetic recording method). As shown in FIG. 1, the suspension board with circuit 1 extends in an up-down direction of the paper surface. In the following description, a direction in which the suspension board with circuit 1 extends is defined as a front-rear direction. The front-rear direction is one example of a plane direction perpendicular to a thickness direction of the suspension board with circuit 1. The suspension board with circuit 1 is capable of being mounted with a slider S including a magnetic head H, and, as one example of an electronic element, a light emitting element L for assisting the magnetic head H (ref: FIG. 3). The magnetic head H is an electronic element for executing reading of data from a recording surface of a hard disk, and writing of data on the recording surface of the hard disk. The light emitting element L is an electronic element for assisting writing of data on the recording surface of the hard disk by the magnetic head H by emitting light such as laser beam to the recording surface of the hard disk and heating the recording surface of the hard disk. When the hard disk drive adopts the thermally assisted magnetic recording method, the electronic element for assisting the magnetic head H is not particularly limited, as long as the recording surface of the hard disk can be heated. An example thereof may include an electronic element that generates a microwave. In the following description, the side at which the slider S is mounted is a front side of the suspension board with circuit 1, and the side opposite thereto is a rear side thereof. A direction perpendicular to both of the front-rear direction and the thickness direction is a width direction of the suspension board with circuit 1. The suspension board with circuit 1 supports the slider S, and allows the magnetic head H and the light emitting element L to be electrically connected to a control board of the hard disk drive.

The suspension board with circuit 1 includes a slider mounting portion 2 on which the slider S is mounted, and a wiring portion 3 in which a wiring pattern (to be specific, a first conductive pattern 13 and a second conductive pattern 15 to be described later) is formed.

The slider mounting portion 2 is formed into a generally rectangular flat plate shape when viewed from the top. The slider mounting portion 2 has an opening 4 having a convex shape. When the slider S is mounted, the light emitting element L is inserted into the opening 4. To be more specific, the opening 4 has a wide portion 4A which has a generally rectangular shape when viewed from the top and into which a main body portion L1 (ref: FIG. 6) of the light emitting element L is inserted, and a narrow portion 4B which has a generally rectangular shape when viewed from the top and into which an emitting portion L2 (ref: FIG. 6) of the light emitting element L is inserted. The narrow portion 4B is disposed at the front side of the wide portion 4A. The narrow portion 4B is shorter than the wide portion 4A in the width direction. The narrow portion 4B continues to the central portion in the width direction of the wide portion 4A.

The wiring portion 3 includes an outrigger portion 3A and a cable portion 3B. The outrigger portion 3A is disposed around the slider mounting portion 2 so as to surround the slider mounting portion 2. To be more specific, the outrigger portion 3A is formed into a generally rectangular frame shape when viewed from the top. The inner circumferential edge at the front side of the outrigger portion 3A continues to the front end portion of the slider mounting portion 2. The inner circumferential edge at the rear side of the outrigger portion 3A is spaced apart from the rear end portion of the slider mounting portion 2. The inner circumferential edge in the width direction of the outrigger portion 3A is spaced apart from the end portion in the width direction of the slider mounting portion 2. The cable portion 3B extends from the rear end portion of the outrigger portion 3A rearwardly.

To be more specific, as shown in FIGS. 1 to 3, the suspension board with circuit 1 includes a metal supporting board 11, a base insulating layer 12 as one example of an insulating layer, the first conductive pattern 13, a cover insulating layer 14, and the second conductive pattern 15.

As shown in FIGS. 2 and 3, the metal supporting board 11 is provided in the slider mounting portion 2 and the wiring portion 3. In the metal supporting board 11, an opening 11A is formed. The opening 11A is formed from the center of the slider mounting portion 2 over the front end of the outrigger portion 3A in the front-rear direction. The opening 11A is formed into a generally rectangular shape when viewed from the top.

The metal supporting board 11 has a thickness of, for example, 15 µm or more, and for example, 50 µm or less, preferably 30 µm or less.

As shown in FIGS. 1 and 3, the base insulating layer 12 is provided in a portion on which the first conductive pattern 13 is formed. To be specific, the base insulating layer 12 is provided in the front end portion of the slider mounting portion 2, and the wiring portion 3. The base insulating layer 12 is disposed at the edge of the front side of the opening 4 in the front end portion of the slider mounting portion 2. To be more specific, the base insulating layer 12 is formed on the upper surface of the metal supporting board 11 so as to cover the front-side half of the opening 11A (ref: FIG. 2) of the metal supporting board 11. In this manner, of the opening 11A of the metal supporting board 11, a portion exposed from the base insulating layer 12 functions as the opening 4. The base insulating layer 12 is disposed between the metal supporting board 11I and the first conductive pattern 13 in the thickness direction of the suspension board with circuit 1. In this manner, the base insulating layer 12 insulates the metal supporting board 11 from the first conductive pattern 13. The base insulating layer 12 includes a first portion 12A and a second portion 12B in the front end portion of the slider mounting portion 2.

The first portion 12A extends over the entire width of the slider mounting portion 2 in the width direction. The first portion 12A extends in the front-rear direction.

The first portion 12A has a thickness of, for example, 1 µm or more, preferably 3 µm or more, and for example, 20 µm or less, preferably 15 µm or less.

The second portion 12B is disposed at the rear side of the first portion 12A in the front-rear direction. The second portion 12B extends from the first portion 12A toward the wide portion 4A of the opening 4 in the front-rear direction. The second portion 12B is disposed at both sides of the narrow portion 4B of the opening 4 in the width direction. The second portion 12B has a wedge shape when viewed in cross section in which one end portion thereof in the thickness direction protrudes rearwardly. To be more specific, the second portion 12B is formed thinner than the first portion 12A so that one surface S1 of the base insulating layer 12 gets closer to the other surface S2 of the base insulating layer 12 in the thickness direction. In other words, the thickness of the second portion 12B is gradually reduced as it goes from the first portion 12A toward the opening 4. The second portion 12B includes an inclined surface S3 that gradually inclines from one surface S1 toward the other surface S2 as it goes from the first portion 12A toward the opening 4.

The second portion 12B has a length in the front-rear direction of, for example, 5 µm or more, preferably 10 µm or more, and for example, 100 µm or less, preferably 50 µm or less.

The length in the front-rear direction of the second portion 12B is longer than the thickness of the first portion 12A. To be specific, the length in the front-rear direction of the second portion 12B with respect to the thickness of the first portion 12A is, for example, 1.5 times or more, preferably twice or more, and for example, 20 times or less.

An acute angle θ formed between the inclined surface S3 and the other surface S2 is, for example, 5° or more, and for example, 30° or less, preferably 20° or less.

The first conductive pattern 13 is disposed on one surface S1 of the base insulating layer 12 in the thickness direction. The first conductive pattern 13 has a thickness of, for example, 3 µm or more, preferably 5 µm or more, and for example, 50 µm or less, preferably 20 m or less. The first conductive pattern 13 includes a plurality (to be specific, 9 pieces) of magnetic head connecting terminals 13A as one example of a first terminal, a plurality (to be specific, 4 pieces) of connecting pads 13B, and a plurality (to be specific, 13 pieces) of wires 13C.

The plurality of magnetic head connecting terminals 13A are disposed on one surface S1 of the first portion 12A in the thickness direction. The number of magnetic head connecting terminals 13A is the same as that of terminals T1 (ref: FIG. 6) of the magnetic head H. The plurality of magnetic head connecting terminals 13A are disposed in parallel in the width direction at spaced intervals to each other. The magnetic head connecting terminal 13A is formed into a generally rectangular shape (square land shape) when viewed from the top. The one piece of magnetic head connecting terminal 13A is electrically connected to the one piece of terminal T1 (ref: FIG. 6) of the magnetic head H at the time of mounting of the slider S.

The magnetic head connecting terminal 13A has a width of, for example, 15 µm or more, preferably 20 µm or more, and for example, 1000 µm or less, preferably 800 µm or less.

An interval between the magnetic head connecting terminals 13A is, for example, 15 µm or more, preferably 20 µm or more, and for example, 1000 µm or less, preferably 800 µm or less.

The plurality of connecting pads 13B are disposed at the front side of the plurality of magnetic head connecting terminals 13A in the front-rear direction. The plurality of connecting pads 13B are disposed in the outrigger portion 3A. The number of connecting pads 13B is the same as that of connecting pads 15B (ref: FIG. 2) of the second conductive pattern 15. The plurality of connecting pads 13B are disposed in parallel in the width direction at spaced intervals to each other. The connecting pad 13B is formed into a generally circular shape (round land shape) when viewed from the top. Each of the plurality of connecting pads 13B fills the inside of a via hole 12C that is formed to pass through the base insulating layer 12.

The connecting pad 13B has a diameter of, for example, 15 µm or more, preferably 20 µm or more, and for example, 1000 µm or less, preferably 800 µm or less.

An interval between the connecting pads 13B is, for example, 15 µm or more, preferably 20 µm or more, and for example, 1000 µm or less, preferably 800 µm or less.

The plurality of wires 13C are disposed in the outrigger portion 3A and the cable portion 3B. The number of the plurality of wires 13C is the same as the total number of the plurality of magnetic head connecting terminals 13A and the plurality of connecting pads 13B. The plurality of wires 13C are disposed at spaced intervals to each other. The one piece of wire 13C is connected to the one piece of the plurality of magnetic head connecting terminals 13A and the plurality of connecting pads 13B. An external connecting terminal, which is not shown, is provided in each of the end portions of the plurality of wires 13C. The external connecting terminals are electrically connected to the control board of the hard disk drive.

The wire 13C has a width of, for example, 5 µm or more, preferably 8 µm or more, and for example, 200 µm or less, preferably 100 µm or less.

An interval in the width direction between the wires 13C is, for example, 5 µm or more, preferably 8 µm or more, and for example, 1000 µm or less, preferably 100 µm or less.

As shown in FIG. 3, the cover insulating layer 14 is disposed on one surface S1 of the base insulating layer 12. The cover insulating layer 14 covers the plurality of wires 13C and the plurality of connecting pads 13B. The magnetic head connecting terminals 13A, and the external connecting terminals, which are not shown, are exposed from the cover insulating layer 14.

In the portion that is disposed on the first conductive pattern 13, the cover insulating layer 14 has a thickness of for example, 1 µm or more, preferably 3 µm or more, and for example, 15 µm or less, preferably 10 µm or less.

In the portion that is disposed on the base insulating layer 12, the thickness of the cover insulating layer 14 is thicker than that of the portion that is disposed on the first conductive pattern 13, and is, for example, 2 µm or more, preferably 4 µm or more, and for example, 20 µm or less, preferably 15 µm or less.

As shown in FIGS. 2 and 3, the second conductive pattern 15 is disposed on the other surface S2 of the base insulating layer 12 at the inside of the opening 11A of the metal supporting board 11. The thickness of the second conductive pattern 15 is the same as that of the metal supporting board 11, and is, for example, 15 µm or more, and for example, 50 µm or less, preferably 30 µm or less. The second conductive pattern 15 includes a plurality (to be specific, 4 pieces) of light emitting element connecting terminals 15A as one example of a second terminal, the plurality (to be specific, 4 pieces) of connecting pads 15B, and a plurality (to be specific, 4 pieces) of wires 15C.

The plurality of light emitting element connecting terminals 15A are disposed on the other surface S2 of the base insulating layer 12 in the thickness direction. The number of light emitting element connecting terminals 15A is the same as that of terminals T2 (ref: FIG. 6) of the light emitting element L. The plurality of light emitting element connecting terminals 15A are disposed in parallel in the width direction at spaced intervals to each other. The light emitting element connecting terminals 15A extend in the front-rear direction. The light emitting element connecting terminal 15A is formed into a generally rectangular shape (square land shape) when viewed from the top. To be more specific, the one piece of the plurality of light emitting element connecting terminals 15A is disposed at the front side of the narrow portion 4B of the opening 4 in the front-rear direction. The three pieces of the plurality of light emitting element connecting terminals 15A are disposed in parallel with the narrow portion 4B of the opening 4 in the width direction. The rear ends of the three pieces of the plurality of light emitting element connecting terminals 15A are disposed on the other surface S2 of the second portion 12B in the thickness direction. That is, at least one piece (to be specific, 3 pieces) of the plurality of light emitting element connecting terminals 15A is overlapped with the second portion 12B in the thickness direction. The rear end edges of the three pieces of light emitting element connecting terminals 15A are overlapped with the rear end edge of the second portion 12B in the thickness direction. The light emitting element connecting terminal 15A is overlapped with the magnetic head connecting terminal 13A in the thickness direction. To be more specific, a portion of the light emitting element connecting terminal 15A is overlapped with a portion of the magnetic head connecting terminal 13A in the thickness direction, and another portion thereof is displaced from the magnetic head connecting terminal 13A in the width direction so as not to be overlapped with the magnetic head connecting terminal 13A in the thickness direction. That is, a portion of the light emitting element connecting terminal 15A is overlapped with a portion of the magnetic head connecting terminal 13A in the thickness direction. The one piece of light emitting element connecting terminal 15A is electrically connected to the one piece of terminal T2 (ref: FIG. 6) of the light emitting element L at the time of mounting of the slider S.

The light emitting element connecting terminal 15A has a width of, for example, 15 µm or more, preferably 20 m or more, and for example, 1000 µm or less, preferably 800 µm or less.

An interval between the light emitting element connecting terminals 15A is, for example, 15 µm or more, preferably 20 µm or more, and for example, 1000 µm or less, preferably 800 µm or less.

As shown in FIGS. 2 and 3, the plurality of connecting pads 15B are disposed at the front side of the plurality of light emitting element connecting terminals 15A in the front-rear direction. The plurality of connecting pads 15B are disposed at spaced intervals to each other in the width direction. The connecting pad 15B is formed into a generally circular shape (round land shape) when viewed from the top. The one piece of connecting pad 15B of the second conductive pattern 15 is electrically connected to the one piece of connecting pad 13B of the first conductive pattern 13.

The connecting pad 15B has a diameter of, for example, 15 µm or more, preferably 20 µm or more, and for example, 1000 µm or less, preferably 800 µm or less.

An interval between the connecting pads 15B is, for example, 15 µm or more, preferably 20 µm or more, and for example, 1000 µm or less, preferably 800 µm or less.

The plurality of wires 15C are disposed at spaced intervals to each other in the width direction. The one piece of wire 15C electrically connects the one piece of light emitting element connecting terminal 15A to the one piece of connecting pad 15B.

The wire 15C has a width of, for example, 5 µm or more, preferably 8 µm or more, and for example, 200 µm or less, preferably 100 µm or less.

An interval in the width direction between the wires 15C is, for example, 5 µm or more, preferably 8 µm or more, and for example, 1000 µm or less, preferably 100 µm or less.

A method for producing the suspension board with circuit 1 is described with reference to FIGS. 4A to 5C.

To produce the suspension board with circuit 1, as shown in FIG. 4A, first, a metal board M is prepared.

Examples of a material that forms the metal board M include metal materials such as stainless steel, 42-alloy, aluminum, copper-beryllium, and phosphor bronze. Preferably, stainless steel is used.

Next, as shown in FIG. 4B, a varnish of a photosensitive resin is applied with a uniform thickness onto the upper surface of the metal board M to be then dried. In this manner, a photosensitive resin layer F having a uniform thickness is formed on the upper surface of the metal board M.

Examples of the photosensitive resin include synthetic resins such as polyimide resin, polyamide imide resin, acrylic resin, polyether nitrile resin, polyether sulfone resin, polyethylene terephthalate resin, polyethylene naphthalate resin, and polyvinyl chloride resin. Preferably, a polyimide resin is used.

Next, a photomask P is disposed at the upper side of the photosensitive resin layer F, and the photosensitive resin layer F is subjected to a gradation exposure to light via the photomask P.

The photomask P includes a gradation pattern consisting of a light shielding portion P1, a light fully transmitting portion P2, and a light semi-transmitting portion P3.

The light shielding portion P1 faces a portion in which the base insulating layer 12 is not formed in the photosensitive resin layer F. The light shielding portion P1 shields light to the photosensitive resin layer F.

The light fully transmitting portion P2 faces a portion in which the base insulating layer 12 other than the second portion 12B is formed in the photosensitive resin layer F. The light fully transmitting portion P2 transmits light to the photosensitive resin layer F.

The light semi-transmitting portion P3 faces a portion in which the second portion 12B is formed in the photosensitive resin layer F. The light semi-transmitting portion P3 transmits light to the photosensitive resin layer F, while the strength thereof is reduced to be lower than that of the light transmitting the light fully transmitting portion P2.

Next, the photosensitive resin layer F is developed.

Then, in the photosensitive resin layer F, the portion facing the light shielding portion P1 is dissolved with a developing solution to be removed. In the photosensitive resin layer F, the portion facing the light fully transmitting portion P2 is not dissolved with the developing solution and remains. In the photosensitive resin layer F, the portion facing the light semi-transmitting portion P3 is partially dissolved with the developing solution and remains with a thinner thickness than that of the portion facing the light fully transmitting portion P2.

Thereafter, the photosensitive resin layer F is cured by heating as needed.

In this manner, as shown in FIG. 4C, the base insulating layer 12 is formed on the upper surface of the metal board M in the above-described pattern. That is, the base insulating layer 12 including the first portion 12A and the second portion 12B is formed.

Next, as shown in FIG. 5A, the first conductive pattern 13 is formed on the upper surface of the base insulating layer 12 by an additive method, a subtractive method, or the like. In this manner, the magnetic head connecting terminal 13A is formed on the first portion 12A.

Examples of a material that forms the first conductive pattern 13 include conductive materials such as copper, nickel, gold, and solder or an alloy thereof preferably, copper is used.

Next, a varnish of a photosensitive resin is applied onto the metal board M and the base insulating layer 12 so as to cover the first conductive pattern 13 to be then dried. Thereafter, the resulting laminate is exposed to light and developed to be then cured by heating.

In this manner, as shown in FIG. 5B, the cover insulating layer 14 is formed in the above-described pattern.

As a material that forms the cover insulating layer 14, the same photosensitive resin as that of the above-described base insulating layer 12 is used.

Thereafter, as shown in FIG. 5C, the metal board M is subjected to etching, and the metal supporting board 11 that is made of the metal board M and the second conductive pattern 15 including the portion that is formed from the metal board M are formed. In this manner, the light emitting element connecting terminal 15A is formed so as to be overlapped with the second portion 12B in the thickness direction. At this time, the opening 4 is also formed. The second conductive pattern 15 may be formed from only the portion that is formed from the metal board M. The light emitting element connecting terminal 15A may also include a portion that is formed from the metal board M and a portion that is not formed from the metal board M (for example, a plating layer) in a case where the light emitting element connecting terminal 15A is subjected to plating treatment.

To subject the metal board M to etching, for example, a method such as dry etching (for example, plasma etching) or wet etching (for example, chemical etching) is used.

In this manner, the suspension board with circuit 1 is completed.

The mounting of the slider S and the light emitting element L on the suspension board with circuit 1 is described with reference to FIGS. 6 to 9.

As shown in FIGS. 6 and 7B, the slider S has a plate shape extending in the front-rear direction. The slider S has a first surface S11 that faces the second portion 12B, and a second surface S12 that is disposed at the opposite side to the second portion 12B with respect to the first surface S11 in the thickness direction. The slider S includes the magnetic head H, and the plurality (to be specific, 9 pieces) of terminals T1 that are electrically connected to the magnetic head H.

The magnetic head H is disposed in the front end portion of the slider S.

The plurality of terminals T1 are disposed on the front end surface of the slider S. The plurality of terminals T1 are disposed in parallel at spaced intervals to each other in the width direction. The terminal T1 is formed into a square land shape extending in the thickness direction.

The light emitting element L is disposed on the first surface S11 of the slider S. The light emitting element L includes the main body portion L1 that is supported by the slider S, the emitting portion L2 that protrudes from the main body portion L1 for emitting light, and the plurality (to be specific, 4 pieces) of terminals T2.

The main body portion L1 has a prismatic column shape extending in the thickness direction. The main body portion L1 is connected at the rear side with respect to the front end portion of the first surface S11 of the slider S in one end portion in the thickness direction.

The emitting portion L2 protrudes from the center in the width direction of the main body portion L1 forwardly. The emitting portion L2 protrudes forwardly with respect to the front end surface of the slider S. In this manner, the emitting portion L2 can emit light toward one side in the thickness direction so as to pass the front side of the slider S. The emitting portion L2 has a prismatic column shape extending in the thickness direction.

The plurality of terminals T2 are disposed on the front end surface of the light emitting element L. To be more specific, the one piece of the plurality of terminals T2 is disposed on the front end surface of the emitting portion L2. Of the plurality of terminals T2, the remaining 3 pieces thereof are disposed on the front end surface of the main body portion L1. The plurality of terminals T2 are disposed in parallel at spaced intervals to each other in the width direction. The terminal T2 is formed into a square land shape extending in the thickness direction.

To mount the slider S on the slider mounting portion 2, first, as shown in FIG. 7A, the light emitting element L is inserted into the opening 4, and the slider S is disposed on the slider mounting portion 2 from one side in the thickness direction. Then, the terminal T1 of the slider S is disposed at the rear side of the corresponding magnetic head connecting terminal 13A. The terminal T2 of the light emitting element L is disposed at the rear side of the corresponding light emitting element connecting terminal 15A. The first surface S11 is disposed between the magnetic head connecting terminal 13A and the light emitting element connecting terminal 15A in the thickness direction.

Next, as shown in FIG. 7B, the slider S and the light emitting element L are moved to the front side so that the terminal T1 of the slider S gets closer to the corresponding magnetic head connecting terminal 13A, and the terminal 12 of the light emitting element L gets closer to the corresponding light emitting element connecting terminal 15A.

At this time, the second portion 12B is formed thinner than the first portion 12A so that one surface S1 gets closer to the other surface S2 and therefore, by using a space at one side in the thickness direction of the second portion 12B, the front end portion of the slider S can be disposed at one side in the thickness direction of the second portion 12B. In this manner, by using the space at one side in the thickness direction of the second portion 12B, the terminal T1 of the slider S can get closer to the corresponding magnetic head connecting terminal 13A, and the terminal T2 of the light emitting element L can get closer to the corresponding light emitting element connecting terminal 15A, while the slider S avoids being brought into contact with the base insulating layer 12.

Figure 8:
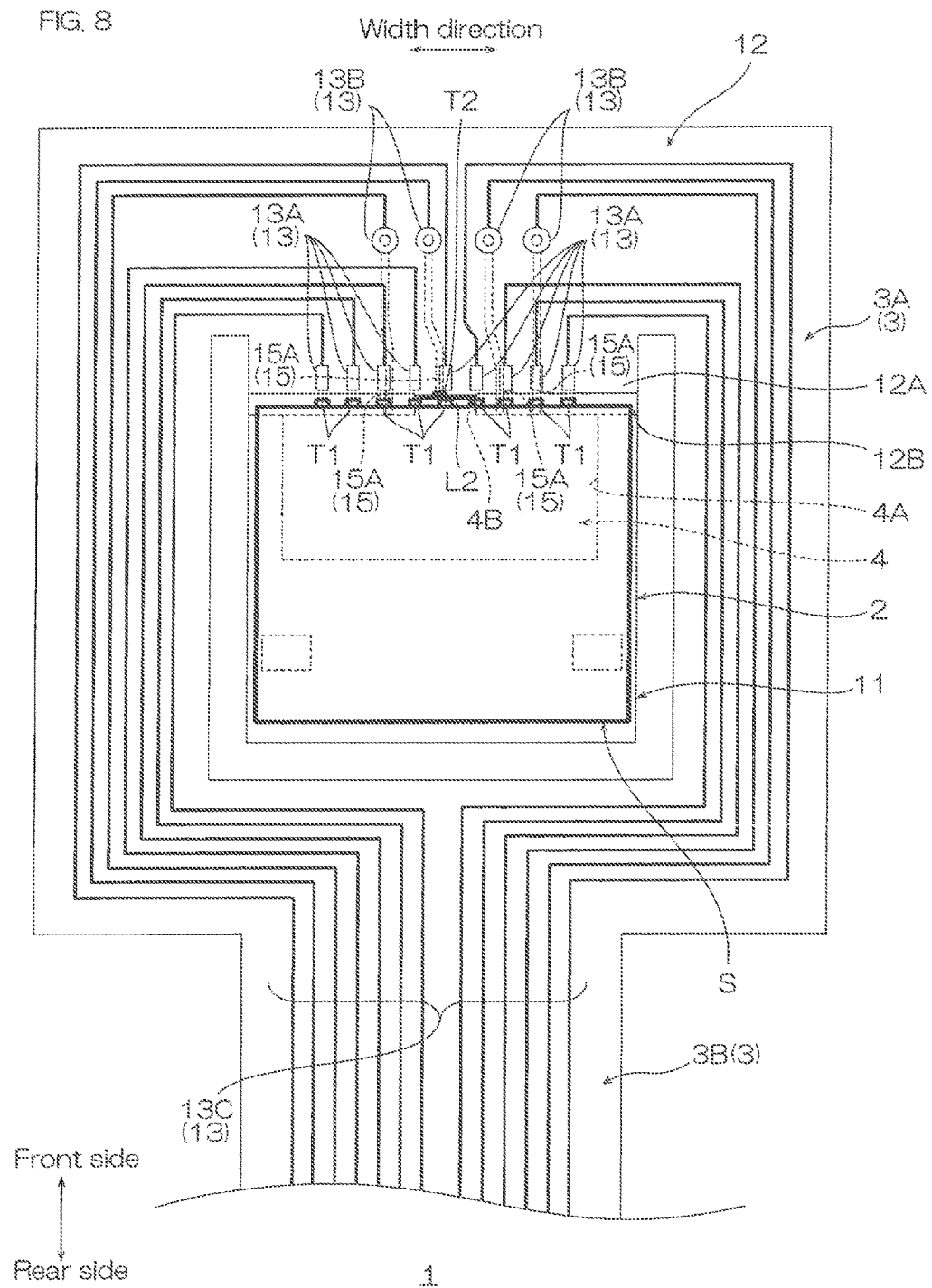
FIG. 8 shows a plan view of the suspension board with circuit shown in FIG. 7B when viewed from one side in the thickness direction.
Figure 9:
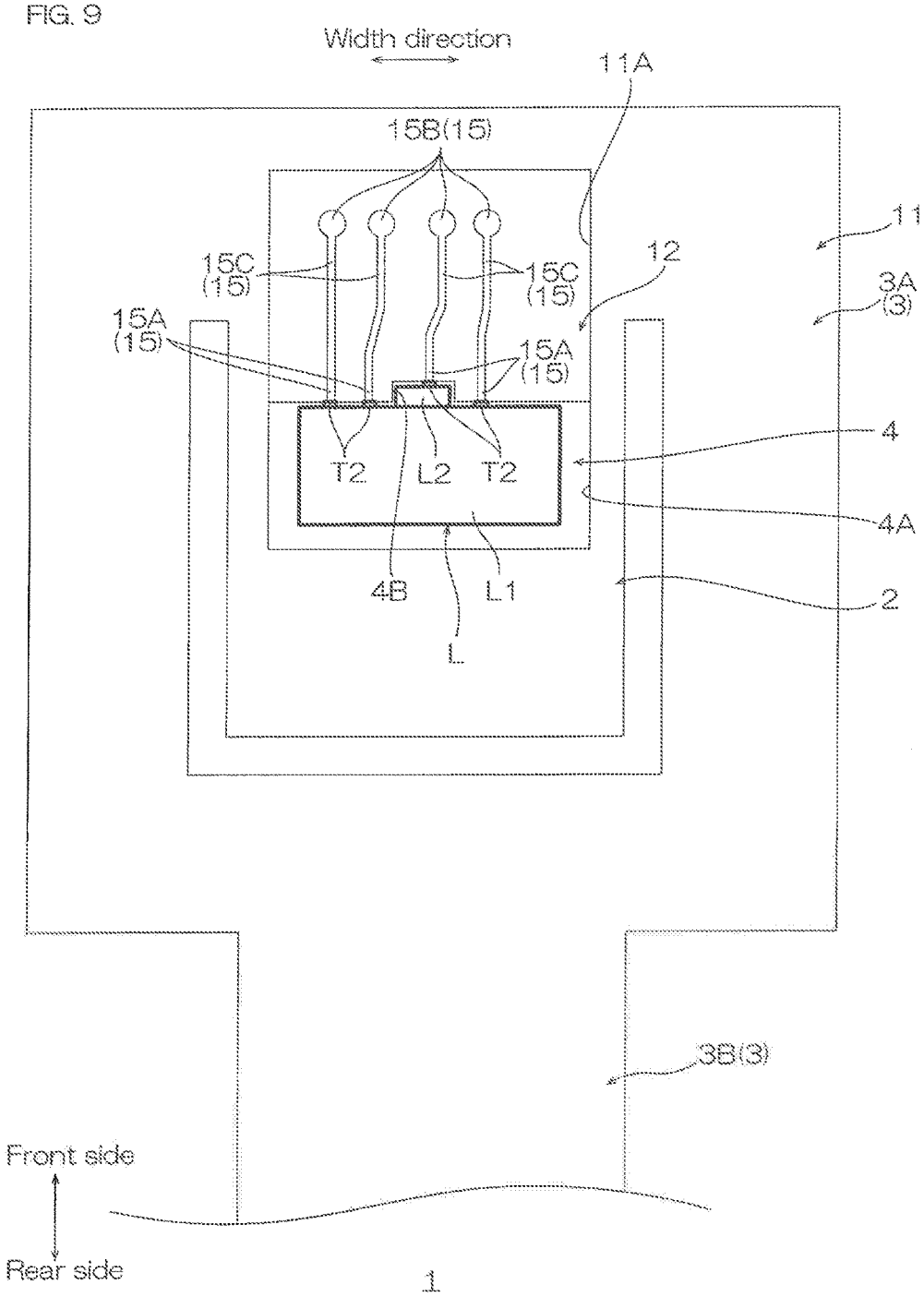
FIG. 9 shows a plan view of the suspension board with circuit shown in FIG. 7B when viewed from the other side in the thickness direction.

Then, as shown in FIG. 8, the front end portion of the slider S is overlapped with the second portion 12B in the thickness direction. That is, the second portion 12B is overlapped with the slider S in the thickness direction. As shown in FIG. 9, the main body portion L1 of the light emitting element L is disposed at the inside of the wide portion 4A of the opening 4, and the emitting portion L2 of the light emitting element L is disposed at the inside of the narrow portion 4B of the opening 4.

At this time, a distance in the front-rear direction between the terminal T1 of the slider S and the corresponding magnetic head connecting terminal 13 is, for example, 200 µm or less, preferably 50 µm or less. The distance in the front-rear direction between the terminal T1 of the slider S and the corresponding magnetic head connecting terminal 13 is usually 10 µm or more.

A distance in the front-rear direction between the terminal T2 of the light emitting element L and the corresponding light emitting element connecting terminal 15A is, for example, 200 μm or less, preferably 50 μm or less. The terminal T2 of the light emitting element L and the corresponding light emitting element connecting terminal 15A may be in contact with each other. That is, the distance in the front-rear direction between the terminal T2 of the light emitting element L and the corresponding light emitting element connecting terminal 15A may be 0.

Thereafter, the terminal T1 of the slider S is connected to the corresponding magnetic head connecting terminal 13A via solder. The terminal T2 of the light emitting element L is connected to the corresponding light emitting element connecting terminal 15A via solder. That is, at least one piece of the plurality of light emitting element connecting terminals 15A is electrically connected to the main body portion L1 at the time of mounting of the slider S.

In this manner, the mounting of the slider S and the light emitting element L on the suspension board with circuit 1 is completed.

According to the suspension board with circuit 1, as shown in FIG. 3, the second portion 12B is formed thinner than the first portion 12A so that one surface S1 gets closer to the other surface S2.

Thus, as shown in FIG. 7B, by using a space at one side in the thickness direction of the second portion 12B, the slider S and the light emitting element L can be moved to the front side so that the front end portion of the slider S is disposed at one side in the thickness direction of the second portion 12B.

In this manner, by using the space at one side in the thickness direction of the second portion 12B, the terminal T1 of the slider S can get closer to the corresponding magnetic head connecting terminal 13A, and the terminal T2 of the light emitting element L can get closer to the corresponding light emitting element connecting terminal 15A, while the slider S avoids being brought into contact with the base insulating layer 12.

Then, the magnetic head connecting terminal 13A can be connected to the terminal T1 of the slider S, and the light emitting element connecting terminal 15A can be connected to the terminal T2 of the light emitting element L in a state where the terminal T1 of the slider S is close to the corresponding magnetic head connecting terminal 13A, and the terminal T2 of the light emitting element L is close to the corresponding light emitting element connecting terminal 15A.

As a result, the slider S and the light emitting element L can be smoothly mounted on the suspension board with circuit 1.

According to the suspension board with circuit 1, as shown in FIG. 3, the second portion 12B includes the inclined surface S3 that gradually inclines from one surface S1 of the base insulating layer 12 toward the other surface S2 thereof as it goes from the first portion 12A toward the opening 4.

As a result, a space can be formed at one side in the thickness direction of the second portion 12B with an easy structure.

According to the suspension board with circuit 1, as shown in FIG. 1, a portion of the light emitting element connecting terminal 15A is overlapped with a portion of the magnetic head connecting terminal 13A in the thickness direction.

To be more specific, a portion of the light emitting element connecting terminal 15A is overlapped with a portion of the magnetic head connecting terminal 13A in the thickness direction, and another portion thereof is displaced from the magnetic head connecting terminal 13A in the width direction so as not to be overlapped with the magnetic head connecting terminal 13A in the thickness direction.

Thus, compared to a case where any one of the magnetic head connecting terminal 13A and the light emitting element connecting terminal 15A is entirely overlapped with any other one of the magnetic head connecting terminal 13A and the light emitting element connecting terminal 15A, a connecting portion of the magnetic head connecting terminal 13A to the terminal T1 of the slider S can be displaced from a connecting portion of the light emitting element connecting terminal 15A to the terminal T2 of the light emitting element L in the width direction.

As a result, a short circuit between the connecting portion of the magnetic head connecting terminal 13A to the terminal T1 of the slider S and the connecting portion of the light emitting element connecting terminal 15A to the terminal T2 of the light emitting element L can be more surely prevented.

When the magnetic head connecting terminal 13A and the light emitting element connecting terminal 15A are largely displaced so as not to be overlapped with each other, the suspension board with circuit 1 may increase in size.

However, according to the above-described structure, a portion of the light emitting element connecting terminal 15A is overlapped with a portion of the magnetic head connecting terminal 13A, so that an increase in size of the suspension board with circuit 1 can be suppressed, while the short circuit between the connecting portion of the magnetic head connecting terminal 13A to the terminal T1 of the slider S and the connecting portion of the light emitting element connecting terminal 15A to the terminal T2 of the light emitting element L can be more surely prevented.

According to the suspension board with circuit 1, as shown in FIGS. 7B and 9, at least one of the plurality of light emitting element connecting terminals 15A is electrically connected to the terminal T2 provided in the main body portion L1 and is overlapped with the second portion 12B in the thickness direction at the time of mounting of the slider S.

Thus, the light emitting element connecting terminal 15A to be connected to the main body portion L1 of the light emitting element L can be disposed close to the main body portion L1 of the light emitting element L.

As a result, the light emitting element L can be more smoothly connected to the light emitting element connecting terminal 15A.

Figure 10:
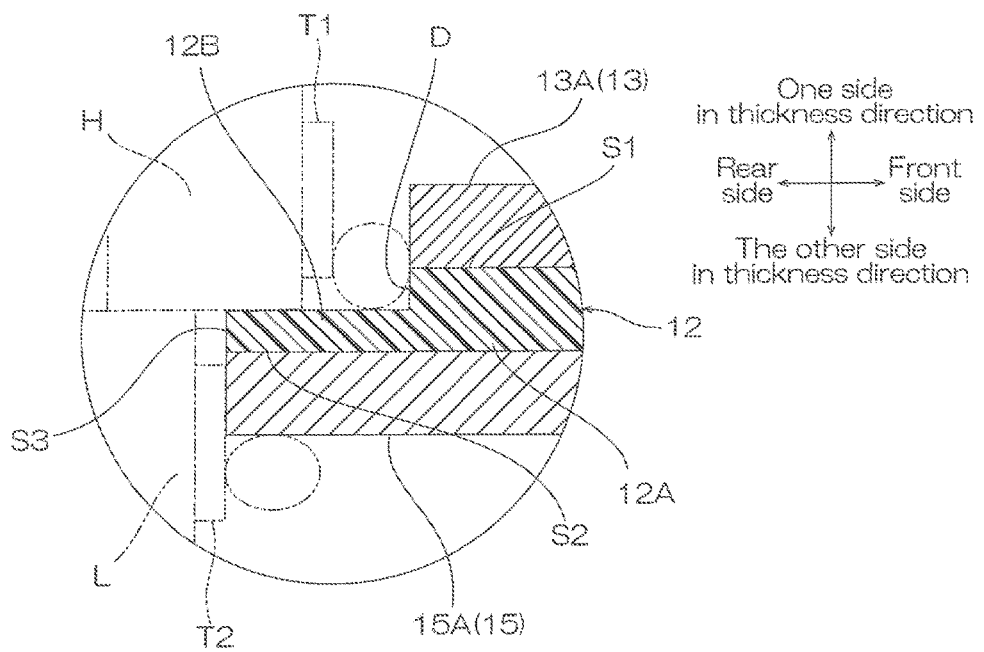
FIG. 10 shows a cross-sectional view showing a modified example of the suspension board with circuit.

In the above-described embodiment, the second portion 12B has a wedge shape when viewed in cross section having the inclined surface S3. However, as shown in FIG. 10, the second portion 12B may be formed thin so as to be dented from one surface S toward the other surface S2. In this case, when the slider S and the light emitting element L are moved to the front side, the front end of the slider S is housed at the inside of a recessed portion D that is defined by the upper surface of the second portion 12B and the rear end surface of the first portion 12A.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:
1. A suspension board with circuit capable of being mounted with a slider including a magnetic head and an electronic element for assisting the magnetic head, and having an opening with the electronic element inserted therein at the time of mounting of the slider comprising:
an insulating layer disposed at the edge of the opening,
a first terminal disposed at one surface of the insulating layer in a thickness direction of the insulating layer and electrically connected to the magnetic head at the time of mounting of the slider, and
a second terminal disposed at the other surface of the insulating layer in the thickness direction and electrically connected to the electronic element at the time of mounting of the slider, wherein
the insulating layer includes a first portion in which the first terminal is disposed and
a second portion that extends from the first portion toward the opening in a plane direction perpendicular to the thickness direction and is overlapped with the slider in the thickness direction at the time of mounting of the slider;
the second portion is thinner than the first portion so that one surface gets closer to the other surface and is overlapped with the second terminal in the thickness direction;
the slider has a first surface facing the second portion and a second surface disposed at the opposite side to the second portion with respect to the first surface in the thickness direction; and
the first surface is disposed between the first terminal and the second terminal at the time of mounting of the slider.

2. The suspension board with circuit according to claim 1, wherein
the second portion includes an inclined surface that gradually inclines from one surface toward the other surface as it goes from the first portion toward the opening.

3. The suspension board with circuit according to claim 1, wherein
a portion of the second terminal is overlapped with a portion of the first terminal in the thickness direction.

4. The suspension board with circuit according to claim 1, wherein the electronic element includes a main body portion supported by the slider and an emitting portion protruding from the main body portion for emitting light;
a plurality of second terminals are provided; and
at least one of the plurality of second terminals is electrically connected to the main body portion and is overlapped with the second portion in the thickness direction at the time of mounting of the slider.

5. A suspension board with circuit capable of being mounted with a slider including a magnetic head and an electronic element for assisting the magnetic head, and having an opening with the electronic element inserted therein at the time of mounting of the slider comprising:
an insulating layer disposed at the edge of the opening,
a first terminal disposed at one surface of the insulating layer in a thickness direction of the insulating layer and electrically connected to the magnetic head at the time of mounting of the slider, and
a second terminal disposed at the other surface of the insulating layer in the thickness direction and electrically connected to the electronic element at the time of mounting of the slider, wherein
the insulating layer includes
a first portion in which the first terminal is disposed and
a second portion that extends from the first portion toward the opening in a plane direction perpendicular to the thickness direction and is overlapped with the slider in the thickness direction at the time of mounting of the slider;
the second portion includes an inclined surface that gradually inclines from one surface toward the other surface as it goes from the first portion toward the opening;
the slider has a first surface facing the second portion and a second surface disposed at the opposite side to the second portion with respect to the first surface in the thickness direction; and
the first surface is disposed between the first terminal and the second terminal at the time of mounting of the slider.

* * * * *